United States Patent [19]

Phelps

[11] 4,196,386
[45] Apr. 1, 1980

[54] METHOD AND PORTABLE APPARATUS FOR TESTING DIGITAL PRINTED CIRCUIT BOARDS

[75] Inventor: Donald E. Phelps, Kettering, Ohio

[73] Assignee: NCR Corporation, Dayton, Ohio

[21] Appl. No.: 895,898

[22] Filed: Apr. 13, 1978

[51] Int. Cl.² .................. G01R 15/12; G06F 11/00; G01R 31/02
[52] U.S. Cl. .................. 324/73 PC; 324/158 F; 371/20
[58] Field of Search .............. 324/158 F, 158 P, 73 R, 324/73 PC; 364/580; 235/302

[56] References Cited

U.S. PATENT DOCUMENTS

| | | | |
|---|---|---|---|
| 3,274,529 | 9/1966 | Berdan | 339/18 C |
| 3,302,109 | 1/1967 | Jones | 324/73 R |
| 3,325,766 | 6/1967 | Kolb et al. | 339/18 C |
| 3,336,434 | 8/1967 | Crimmins | 339/18 R |
| 3,409,828 | 11/1968 | Kelsey | 324/73 R |
| 3,549,996 | 12/1970 | Vaughan | 324/73 R |
| 3,646,438 | 2/1972 | Staff | 324/73 R |
| 3,657,527 | 4/1972 | Kassabgi et al. | 324/73 PC |
| 3,676,777 | 7/1972 | Charters | 324/73 R |
| 3,739,349 | 6/1973 | Burdette, Jr. et al. | 324/73 R |
| 3,922,537 | 11/1975 | Jackson | 324/73 R |
| 3,931,506 | 1/1976 | Borrelli et al. | 235/302 |

OTHER PUBLICATIONS

Frohwerk, R. A.; "A New Digital . . . ", Hewlett-Packard Journal, May 1977, pp. 2–8.
Chan, A. Y.; "Easy-To-Use Signature Analyzer . . . ", Hewlett-Packard Journal, May 1977, pp. 9–14.
Nadig, H. J.; "Signature Analysis–Concepts . . . ", Hewlett-Packard Journal, May 1977, pp. 15–21.
Korosec et al., "Programmable Connector", IBM Tech. Dis. Bull., Aug. 1972, pp. 865–866.
Northrop et al., "Isolation Circuit Tool", IBM Tech. Dis. Bull., Jun. 19 1960, pp. 7 and 8.

*Primary Examiner*—Rudolph V. Rolinec
*Assistant Examiner*—Ernest F. Karlsen
*Attorney, Agent, or Firm*—J. T. Cavender; Albert L. Sessler, Jr.

[57] ABSTRACT

Portable tester and method for testing a variety of circuit boards without utilizing adaptor boards for re-routing input test signals and supply voltage from the tester to pins of the board under test. A plurality of edge adaptors having different pin spacings have their respective pins connected in parallel to corresponding edge connector stake pins. Each edge connector stake pin is connected to or isolated from the corresponding driver/sensor stake pin by means of a switch. Each driver/sensor stake pin is connected to the input/output terminal of a programmable driver/sensor circuit. A plurality of power supply stake pins are connected to various power supplies of the portable tester. Connectors coupled to the family board can be utilized to route power supply voltages to electrically isolated edge connector stake pins. Isolated driver/sensor outputs can be routed to other edge connector stake pins. A main processor stores a test program and transmits data and control information to predetermined driver/sensor circuits. A high speed processor is coupled between the main processor and the inputs of the driver/sensor circuits. The high speed processor memory can store a bus-defining subroutine containing a sequence of data shifting instructions which shift a word in the shift register to the input of specified driver/sensor circuits at high speed. The high speed preocessor can synchronize the operation of the portable tester with an asynchronously operating printed circuit board under test.

14 Claims, 11 Drawing Figures

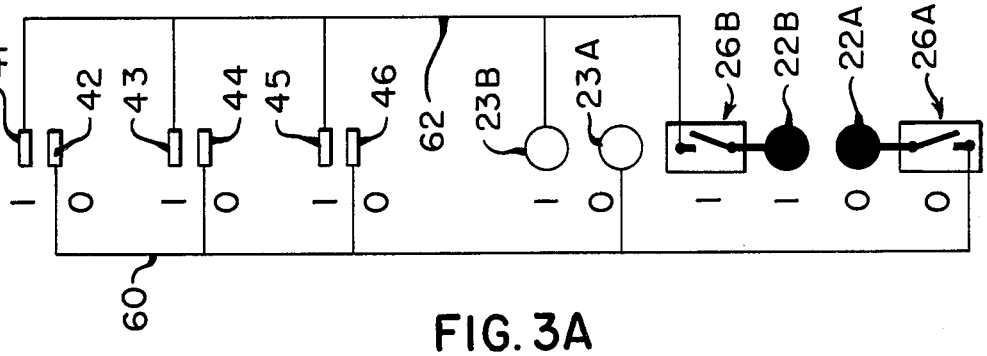
FIG. 3B
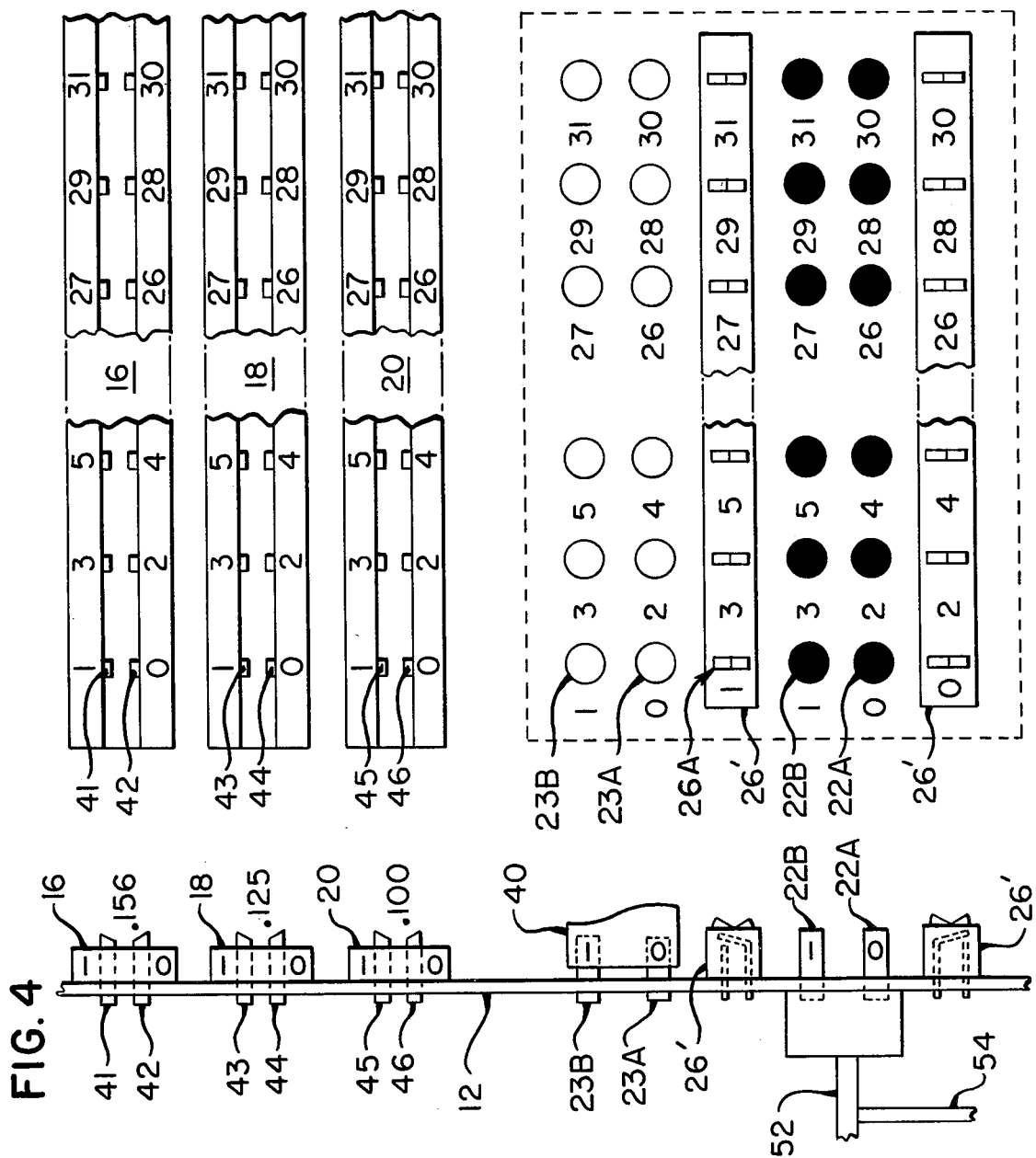
FIG. 3A
FIG. 4

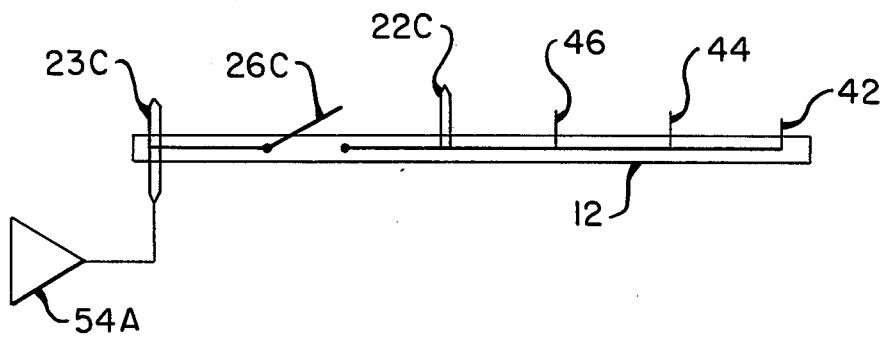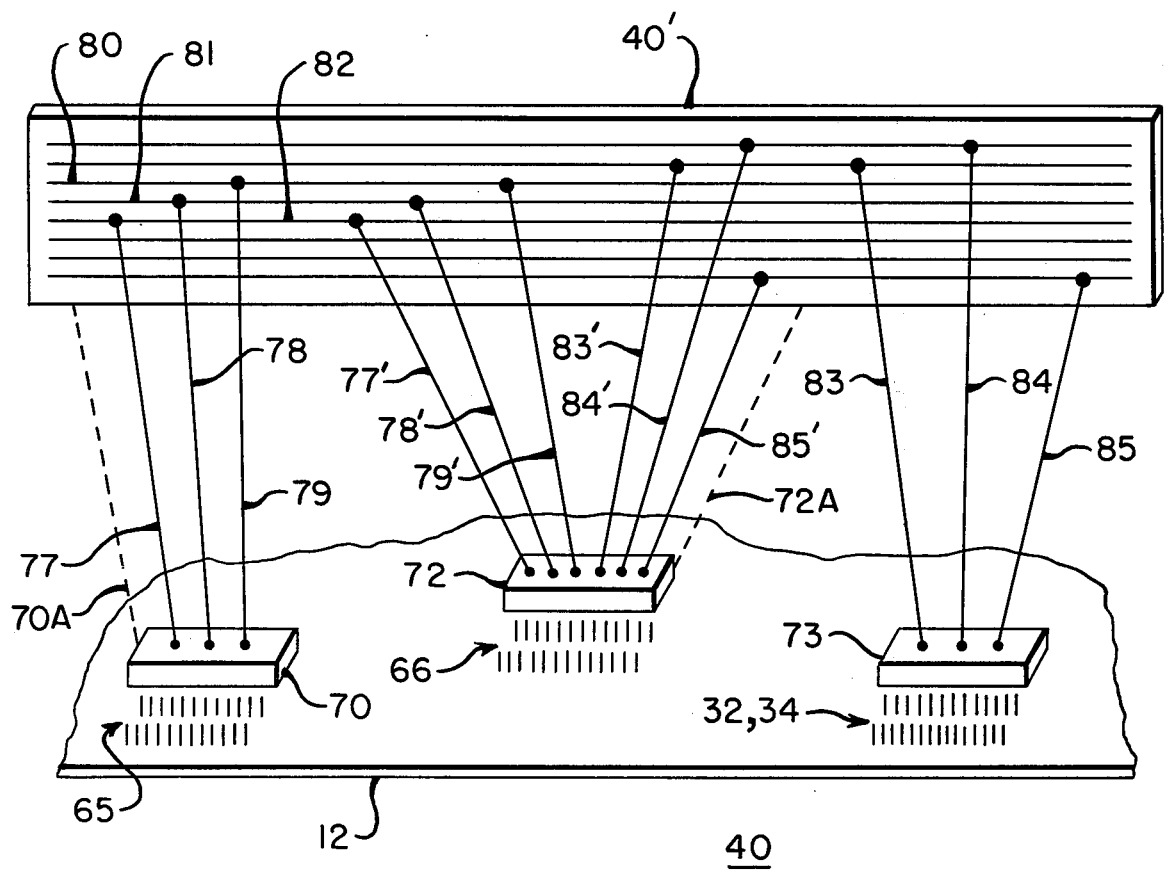

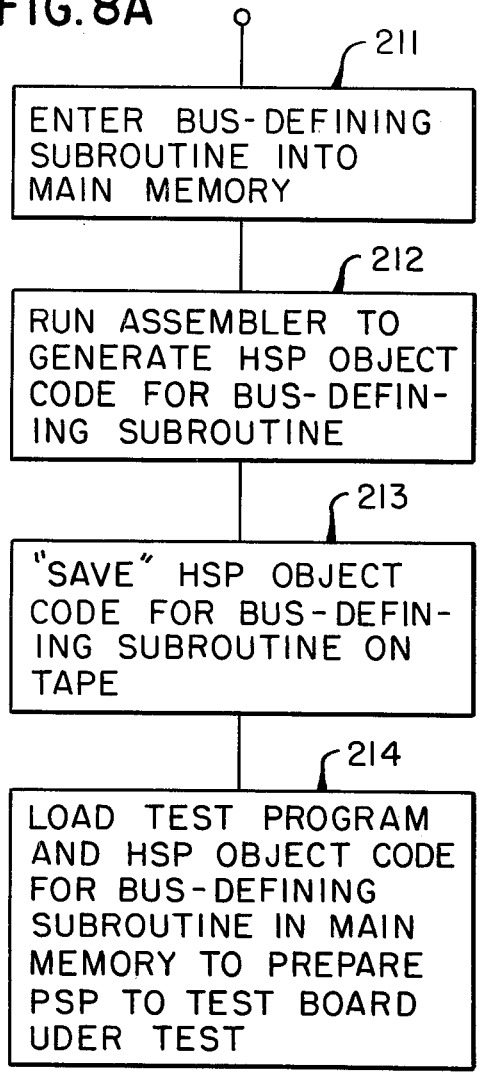
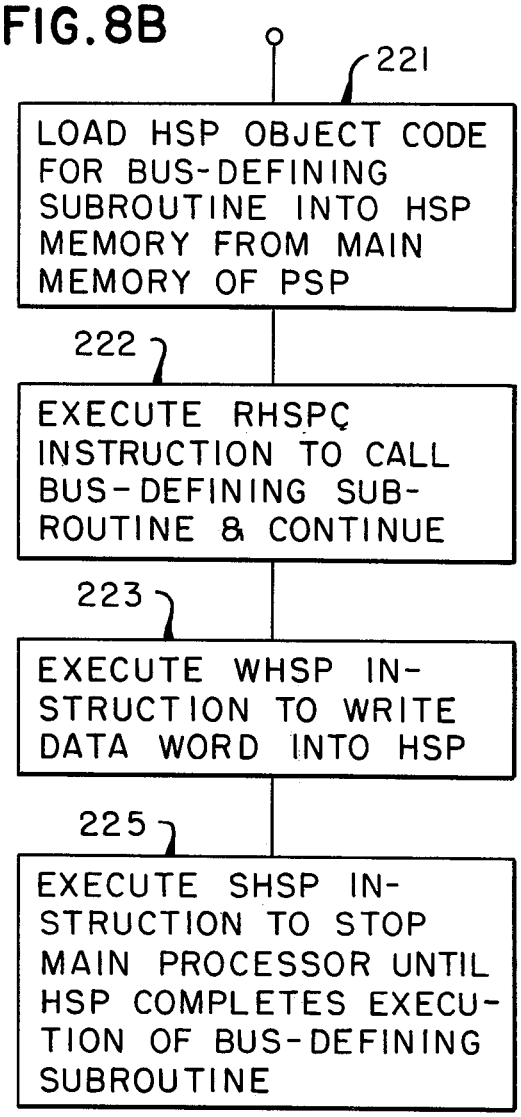
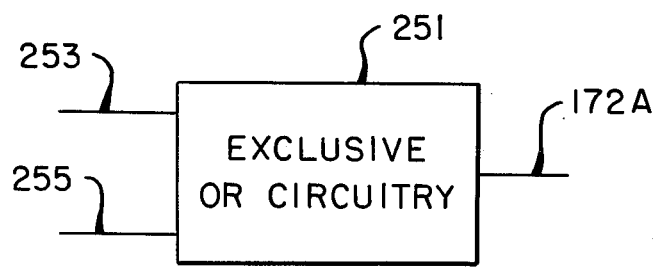

METHOD AND PORTABLE APPARATUS FOR TESTING DIGITAL PRINTED CIRCUIT BOARDS

BACKGROUND OF THE INVENTION

The invention relates to testers and methods for testing digital circuits, and more particularly to portable computer-based testers and methods for testing digital printed circuit boards.

Modern complex digital electronic equipment is ordinarily fabricated utilizing printed circuit boards which include a large number of digital integrated circuits and other components mounted thereon. Manufacturers of such complex electronic equipment are frequently obligated to service installed units. Such servicing involves testing the electronic equipment to isolate and repair (or replace) faulty components. Consequently, it is necessary to test printed circuit boards at the site of the electronic equipment. Such "on site" testing is referred to as "field service testing", in contrast to "factory testing", the latter testing being performed by the manufacturer on printed circuit boards which must be returned to the factory for testing and repair because the field testers presently available are incapable of isolating faulty components at the site of the installed electronic equipment, and because the field service testing personnel, who ordinarily are not extensively trained in details of repairing logic circuitry of the variety of different types of printed circuit boards which may have to be tested, are incapable of making "on the spot" repairs or component replacements.

Certain of the above-described "factory testers" are capable of testing each node in the printed circuit board under test and identifying faults by comparison of each node response to a known correct response for that node. Such factory testers require that the complete data stream be stored for every node of both the printed circuit board under test and an identical "known good" board. The "factory testers" which have the above capability require large memories. In order to reduce the need for complex interface adaptor boards to "interface" between the above factory testers and various families of printed circuit boards to be tested, factory testers have utilized programmable driver/sensor circuits electrically connected to every pin of the board under test and have utilized expensive multiplexing circuitry to route data from the main processor to predetermined ones of the driver/sensor circuits in order to achieve suitably high rates of transferring input test data from the main processor to the board under test. However, such multiplexing circuitry is very expensive. In order to provide the clock signals required by many digital printed circuit boards, factory testers have utilized large serial random access memories connected in series with inputs of each of the programmable driver/sensor circuits. The data stream inputted into each input of the printed circuit board under test is initially stored in a respective one of the high speed serial random access memories. The respective data streams are then outputted as a burst of logical ones and zeros from each of the serial memories. However, the cost of providing such serial memories for this purpose is very high.

Unfortunately, because of the complexity of prior "factory testers" which have the capability of testing and isolating faults in complex digital printed circuit boards, the techniques utilized in the prior "factory testers" are unsuited for implementation in lightweight, low cost portable computerbased testers for "on site" testing of printed circuit boards of installed digital electronic equipment.

In spite of the high cost and complexity of such factory testers, in order to route power supply voltages to the appropriate power supply pins of various families of printed circuit boards, it has been necessary to use adaptor boards or relays to route programmable power supplies of the factory tester to the appropriate pins of the printed circuit board under test.

Because of the above factors, presently available factory testers cost in the range from approximately $50,000 to approximately $250,000. This cost range greatly exceeds the permissable range for a portable service tester. Unfortunately, the very high cost and large physical size of factory testers is mainly due to the inclusion therein of the features which give available factory testers their vastly improved testing and fault isolation capability over presently available portable field service testers, namely the very large memory storage requirements for storing incoming data and known correct responses for boards under test, the complex multiplexing and control circuitry associated with every input/output pin of the test, and large serial random access memories associated with each input/output pin of the tester to provide high speed inputting of data to each pin of the board under test.

Up to now, presently available portable field service testers are incapable of automatic guided probe fault isolation and are incapable of isolating faults in digital loops. Specialized adaptor boards are required to accomplish re-routing of test signals and power supply signals to the proper pins of the board under test. Further, presently available portable field service testers are incapable of generating high speed clock signals necessary to test many digital printed circuit boards, necessitating provision of clock generating circuitry on the abovementioned adaptor boards. Further, the known portable testers (and most factory testers) have been incapable of suitably testing asynchronously operating printed circuit boards, such as microprocessor-based printed circuit boards having free running clock generating circuits. It has generally been necessary to unplug the microprocessor and/or clock generating circuitry and then attempt to test the remainder of the printed circuit board by stimulating it with signals produced by the tester.

Consequently, presently available portable field service testers must be accompanied by a variety of specialized adaptor boards to permit testing of the variety of printed circuit boards likely to be encountered in various types of electronic equipment. Due to the inability of present portable field service testers to isolate faults in digital printed circuit boards under test, it is necessary to maintain a large stock of "spare" boards which are utilized to temporarily replace printed circuit boards found to be defective in the electronic equipment, and to ship the defective boards back to the factory for thorough testing using a factory tester. The defects, once isolated at the factory, are then repaired, and the boards are shipped back to the site of the installed electronic equipment and "plugged in", and the temporary "spare" board is returned to the inventory of "spares". The high overhead costs and inconvenience associated with maintaining an inventory of "spare" printed circuit boards as well as a variety of adaptor boards presently adds greatly to the inconvenience and cost of field service testing.

A number of U.S. patents have been found which are believed relevant. U.S. Pat. No. 3,739,349 discloses a programmable driver/sensor circuit. U.S. Pat. No. 3,922,537 discloses an automatic tester having programmable multiplexing apparatus to electrically connect different measurement and stimulus devices to each pin of the board under test. The latter approach is used by most factory testers, and is too bulky and too expensive for utilization in portable field service testers.

The forefront of the art in the area of portable service processors is believed to be generally indicated by U.S. Pat. Nos. 3,976,864 and 3,924,181 and is also believed to be indicated by the following articles: "Signature Analysis: A New Digital Field Service Method", by Robert A. Frohwerk, pages 2–8 Hewlett-Packard Journal, May, 1977; "Easy-to-Use Signature Analyzer Accurately Trouble-Shoots Complex Logic Circuits" by Anthony Y. Chan, pages 9–14, Ibid., and "Signature Analysis-Concepts, Examples and Guide Lines" by Hanns J. Nadig, pages 15–21, Ibid.

Other references found in a search pertaining to the present disclosure include the following U.S. Pat. Nos.: 3,274,529; 3,325,766; 3,336,434; 3,409,828; 3,549,996; 3,646,438; 3,657,527; 3,676,777; 3,739,349; and 3,922,537.

There is clearly a great need at the present time for a low cost portable field tester capable of permitting ordinary service personnel to quickly "field test" individual printed circuit boards in installed electronic equipment and isolate faults at the component level so that faulty components may be quickly identified and replaced at the installation site of the electronic equipment. It is necessary that such a low cost portable field tester have testing and fault isolation power approaching that of factory testers, which are presently much larger and more expensive than is acceptable for a portable field service tester.

SUMMARY OF THE INVENTION

Accordingly, it is an objective of the invention to provide an economical tester and method for testing a variety of printed circuit boards without utilization of complex adaptor apparatus to effect routing of signals and voltages from the tester and a printed circuit board to be tested.

It is another object of the invention to provide a processor-based tester and method for reducing the programming burden of testing printed circuit boards.

It is another object of the invention to provide a portable testing apparatus and method which requires a minimum number of program steps in the test program in order to effect high speed transfer of a data word from the testing apparatus to a predetermined group of pins of a device to be tested.

It is another object of the invention to provide method and testing apparatus for rapidly and economically transferring a data word to a predefined group of pins of a device to be tested.

It is another object of the invention to rapidly transfer data from a portable tester to a predefined group of inputs of a device to be tested utilizing a minimum amount of circuitry in the tester.

It is another object of the invention to rapidly transfer a data word from a main processor of a tester to a predefined group of pins of a device to be tested without requiring a large amount of multiplexing circuitry and/or memory circuitry corresponding to each input/output pin of the tester.

It is another object of the invention to provide a testing system and method which easily permits re-routing of signals and voltages produced by the testing system to various pins of a device to be tested.

It is another object of the invention to provide a testing system and method which permits convenient routing of signals from the testing system to a printed circuit board to be tested having connectors on different edges thereof.

It is another object of the invention to provide a convenient system and method for increasing the rate of data transfer of a data word from a low speed processor to a predetermined group of remote conductors.

It is another object of the invention to provide a driver/sensor circuit for use in a testing system which avoids the requirement of providing resistive termination devices on printed circuit boards tested by the tester.

It is another object of the invention to provide a portable tester with an information entry system which simplifies entry of commands and reduces the likelihood of producing errors into entry of information.

Another object of the invention is to provide a tester and method for economically testing an asynchronously operating printed circuit board or digital circuit.

BRIEF DESCRIPTION OF THE DRAWINGS

FIG. 3A is an enlarged partial view of the connector board of FIG. 2.

FIG. 3B is a schematic diagram showing the connection of the edge connector pins, switches, and stake pins of the arrangement of FIG. 3A.

FIG. 4 diagrammatically illustrates an edge view of the connector board of FIG. 3A, its relationship to a mother board of the portable service tester of FIG. 1, and a portion of a connector of the family board of FIG. 6 connected to two of the stake pins of the connector board.

FIG. 5 is a diagram illustrating the electrical connection of a driver/sensor circuit to a driver/sensor stake pin, edge connector stake pin, and edge connector pins of the connector board of FIGS. 2 and 3.

FIG. 6 is a perspective diagram illustrating the approximate structure and electrical connections of a family board utilized in conjunction with the portable service tester of FIG. 1.

FIG. 8A is a flow chart indicating the necessary steps for producing a bus-defining subroutine to be stored in the memory of the high speed processor of FIG. 7.

FIG. 8B is a diagram showing steps of the operation of the main processor of the tester of FIG. 1 operating in accordance with a subroutine produced in accordance with the steps of FIG. 8A.

FIG. 9 is a schematic diagram illustrating circuitry utilized to suspend operation of the HSP clock generator during execution of a WAIT instruction.

DESCRIPTION OF THE INVENTION

Figure 1:
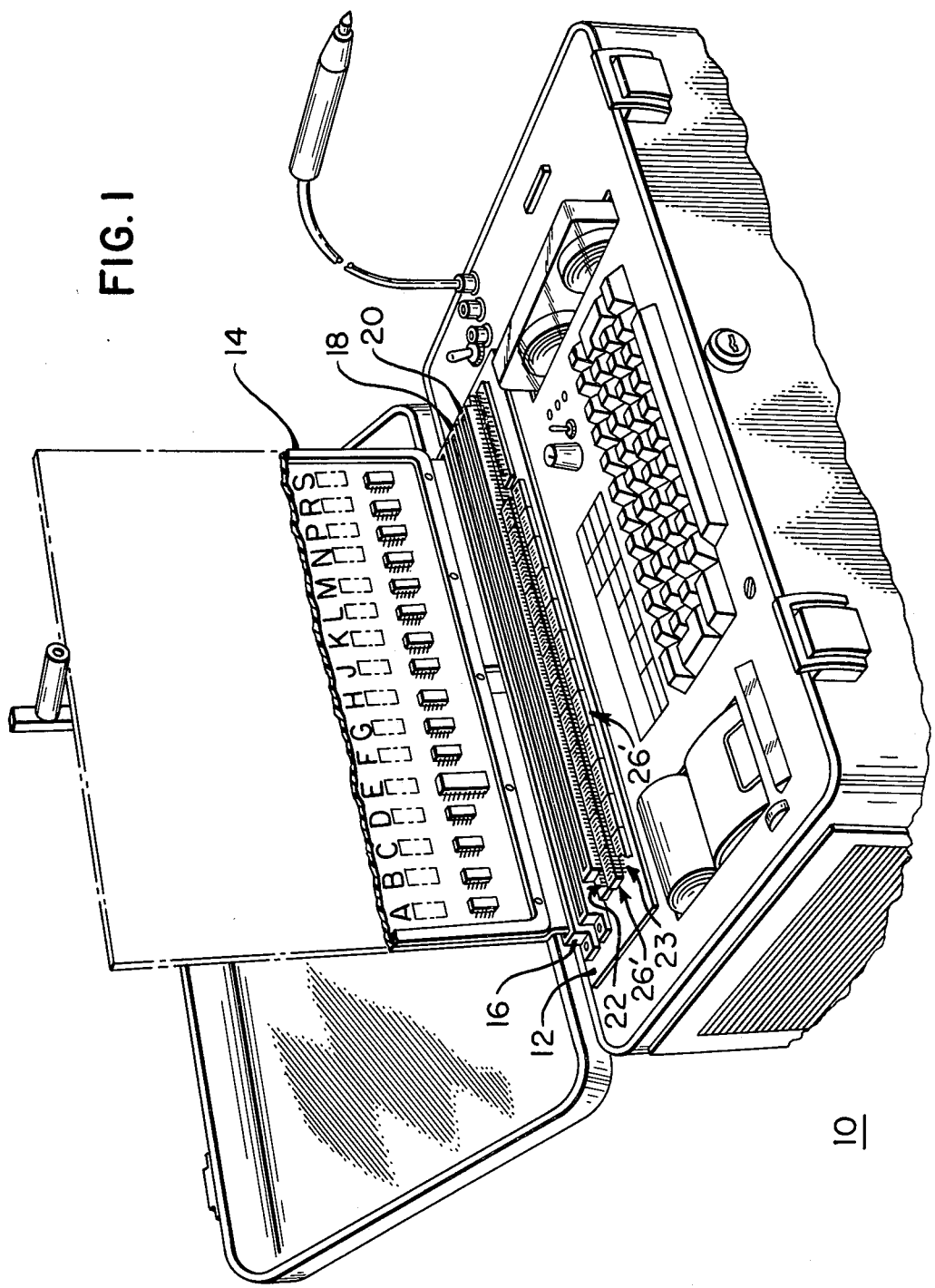
FIG. 1 is a perspective view of the portable service processor of the present invention.

The digital tester of this invention is further described in the co-pending United States patent application entitled, "METHOD AND APPARATUS FOR ISOLATING FAULTS IN A LOGIC CIRCUIT", Ser.

No. 895,892, docket number 2653 by Robert G. Fulks, Robert E. Enfield, and Eric Sacher, "METHOD AND APPARATUS FOR TRANSMITTING DATA TO A PREDEFINED DESTINATION BUS", Ser. No. 895,891, docket number 2717 by Robert G. Fulks, Robert E. Enfield, and Edward H. Greenwood, and "TESTER WITH DRIVER/SENSOR CIRCUIT HAVING PROGRAMMABLE TERMINATION DEVICES", Ser. No. 895,899, docket number 2718 by Robert G. Fulks and Robert E. Anderson, all filed on even date herewith, and incorporated herein by reference.

Referring to the drawings, and particularly to FIGS. 1-5, portable service processor 10, hereinafter referred to as the PSP, includes a connector board 12. Connector board 12 permits electrical connection between the PSP and printed circuit board 14 hereinafter referred to as the "board under test", or simply as the board to be tested. Connector board 12 provides the PSP with the flexibility to be directly connected to the edge connectors of most printed circuit boards to be tested, thereby avoiding the necessity of special adaptors to permit electrical connection on the PSP to various printed circuit boards to be tested.

Figure 2:
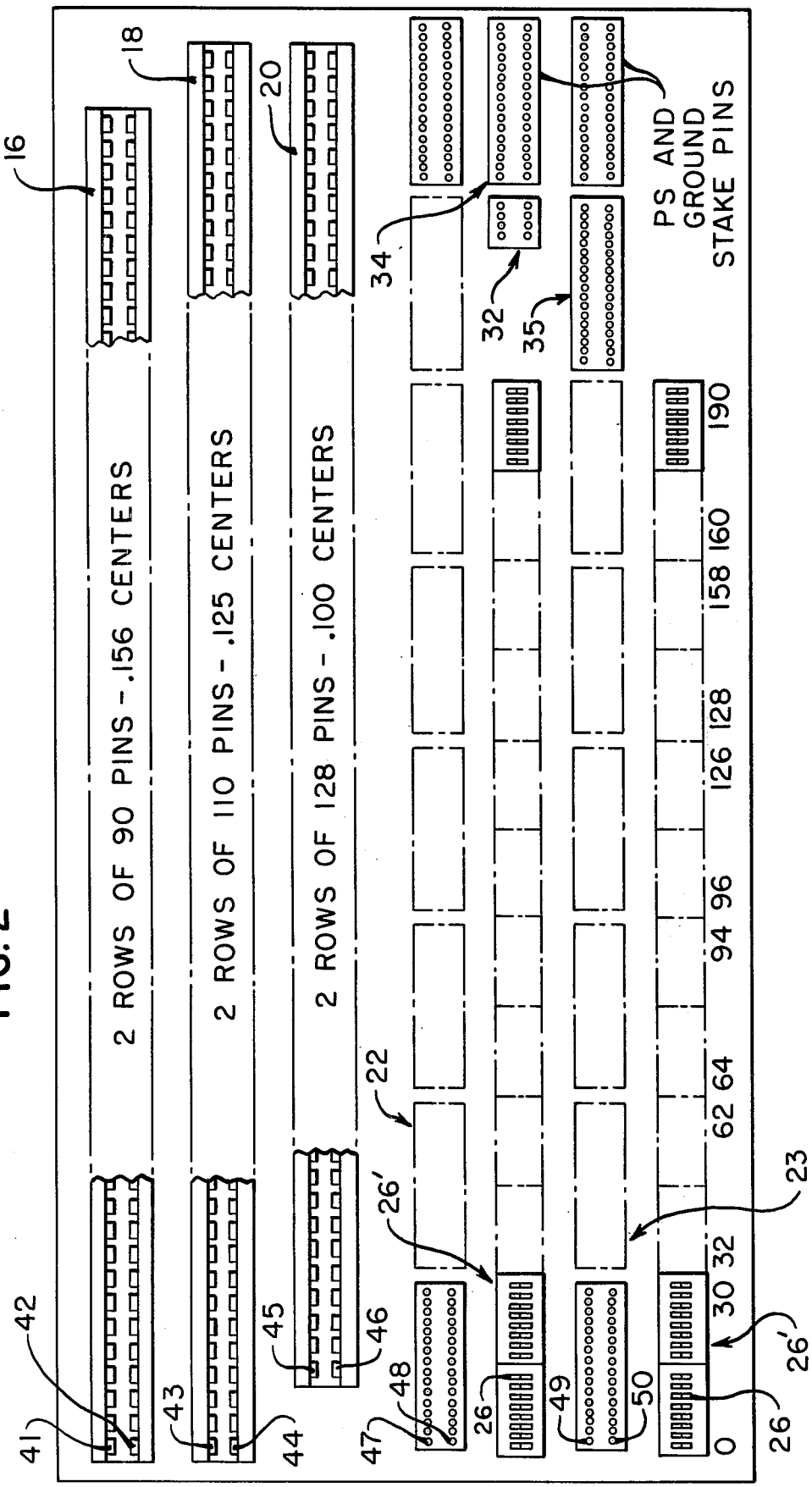
FIG. 2 is a plan view of the connector board of the portable service testing processor of FIG. 1.

Connector board 12 includes three edge connectors 16, 18 and 20 as indicated in FIGS. 1 and 2. Edge connector 16, into which the edge connector of board under test 14 is plugged, includes two rows of ninety pins each spaced at 0.156 inch centers. Edge connector 18 includes two rows of 110 pins each spaced at 0.125 inch centers. Edge connector 20 includes two rows of 128 pins each spaced at 0.100 inch centers. These three edge connectors include the three most conventional pin spacings used in commercially available devices, and thereby permit the PSP to accept most printed circuit board edge connectors.

Connector board 12 also includes a double row of "edge connector stake pins", designated generally by reference numeral 22. The edge connector stake pins 22 are utilized for connection to a "family board" 40, subsequently described with reference to FIG. 6. The edge connector stake pins 22 are spaced on 0.100 inch centers and are connected on a one-to-one basis with the 256 pins of edge connector 20. The 220 pins of edge connector 18 are connected to selected ones of the edge connector stake pins 22. The first 180 pins of edge connector 16 are connected on a one-to-one basis to the first 180 edge connector stake pins 22. The edge connector stake pins 22 provide external access to the edge connector pins connected thereto. Thus, it is seen that corresponding edge connector pins of edge connectors 16, 18 and 20 are connected in parallel; the parallel connection of several of such corresponding edge connector pins is shown in FIG. 3B, described subsequently.

Connector board 12 further includes a double row of driver/sensor stake pins generally designated by reference numeral 23. Driver/sensor stake pins 23 are used to permit connection of the outputs of the individual driver/sensor circuits described in the above-mentioned copending Fulks application (docket number 2653), incorporated herein by reference, and hereinafter referred to as the Fulks application to various other connectors of the board under test. Such connection to various other connectors is accomplished by utilizing the abovementioned "family board" 40 and by opening corresponding "DIP switches" subsequently described. That is, various ones of driver/sensor stake pins 23 can be connected to various ones of edge connector stake pins 22 by means of the family board 40.

The driver/sensor stake pins 23 provide access to particular ones of the driver/sensor circuits which have been electrically disconnected from the edge connector stake pins 22 by opening corresponding ones of DIP switches 26. Each DIP (dual in-line package) switch package such as 26' in FIG. 2 includes eight toggle switches (such as 26B in FIG. 3B), each of which, when closed, connects a driver/sensor circuit output and a driver/sensor stake pin (i.e., one of driver/sensor stake pins 23) connected thereto to a corresponding one of edge connector stake pins 22. The DIP switches 26 are normally left in the closed position, but can be opened during the PSP setup procedure for a particular printed circuit board or family of printed circuit boards to be tested. For example, if the board to be tested requires a power supply voltage that exceeds the ±15 volt range over which the driver/sensor circuits must be protected, the corresponding DIP switches 26 should be opened before connecting the family board to apply such high power supply voltages to the power supply inputs of the board under test. The DIP switches 26 can also be left in the open position if the board under test generates any output voltages outside of the ±15 volt range in order to avoid damage to the driver/sensor circuits by such over-range output voltages.

Further, if the board under test requires connection of driver/sensor circuit outputs to edge connector pins numbered above 191, driver/sensor stake pins 23 connected to unused driver/sensor circuits can be isolated from their corresponding edge connector pins by opening the corresponding DIP switches 26 and routing the signals from the driver/sensor stake pins 23, by means of a suitable family board 40, to the edge connector stake pins 22 corresponding to the edge connector pins at which such driver/sensor output signals are required.

Thus, the DIP switches 26 are utilized to isolate driver/sensor outputs from corresponding edge connector pins when either (1) the driver/sensor output is to be routed elsewhere than to the corresponding edge connector pin, or (2) the corresponding edge connector pin is to receive a voltage or signal other than the output signal of the corresponding driver/sensor circuit output. For example, the corresponding edge connector pin may need to have a power supply voltage applied to it.

Connector board 12 further includes a plurality of power supply stake pins and ground stake pins generally designated in FIG. 2 by reference numerals 34 and 32, respectively. Power supply stake pins 32 and 34 are individually connected to various constant power supply outputs and programmable power supply outputs which are included in the PSP. Power supply stake pins 34 permit use of the family board to re-route power supply voltages to predetermined edge connector stake pins 22, thereby providing the necessary power supply voltages to the required power supply input pins of the board under test.

Figure 7:
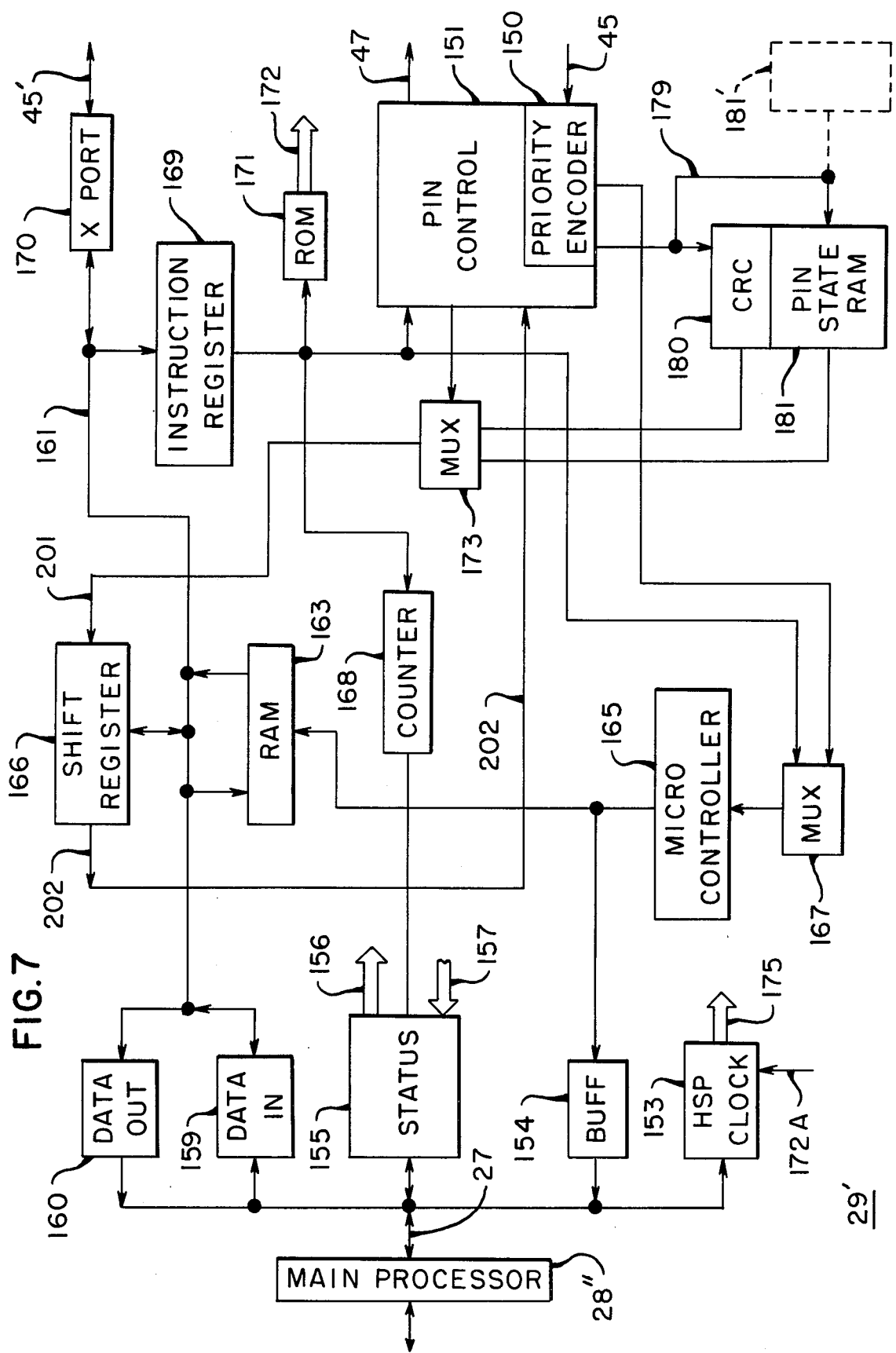
FIG. 7 is a block diagram of the high speed processor of the portable service tester of FIG. 1.

It should be noted that a group of stake pins 35 coupled to the internal high speed bus 161 of the high speed processor (HSP) of FIG. 7 are included on connector board 12 to permit external access to the internal high speed bus of the HSP.

Family board 40 is shown in perspective view in FIG. 6, and also appears in an edge view in FIG. 4. Family board 40 is a long, narrow board having provision for mounting connectors or sockets that can be plugged onto specific edge connector stake pins 22, driver/sensor stake pins 23, and/or power supply stake pins 32, 34. Various wires or conductors of family board 40 provide electrical connection between predetermined groups of the above stake pins, so that various power supply voltages can be connected to edge connector stake pins 22 connected to the power supply inputs of the board under test and to connect output signals from unused driver/sensor stake pins 23 to edge connector stake pins connected to input pins or output pins of the board under test which are numbered higher than 191 or which are positioned such that they cannot be directly plugged into one of the edge connectors 16, 18, or 20 of the HSP.

The objective of the above-described arrangement of stake pins, DIP switches, and family board and associated connectors is to permit electrical connection of power supply voltages, ground voltages, and various driver/sensor output signals to "non-corresponding" pins of the board under test, should such connection be necessary for a particular board under test. This arrangement is desirable because of the fact that most digital electronic products and product families contain at least one "mother board" having a plurality of edge connectors for receiving a plurality of printed circuit boards. The pin definitions for power supply voltages, clock signals, and various data busses and the like are ordinarily the same for all printed circuit boards which are plugged into a particular mother board, and may be the same for an entire family of products. Thus, a single family board usually may be utilized to connect all the printed circuit boards of a particular family of products to the PSP for testing purposes.

It should be noted that some printed circuit boards have connectors which cannot be received by edge connectors 16, 18, or 20 of the PSP. Such connectors may, nevertheless, be electrically connected to the PSP by means of special connecting cables which have sockets or the like connected to each end thereof. The sockets on one end can be connected to the appropriate driver/sensor stake pins or power supply stake pins, and the connectors on the other end may be connected to the pins of the otherwise un-engageable connector of the board under test.

FIG. 3A shows an enlarged view of a portion of the connector board 12 of FIG. 2. FIG. 3B indicates how the edge connector pins numbered 0 and 1 are connected to the corresponding edge connector stake pins 22, driver/sensor stake pins 23, and DIP switches 26. As explained above, corresponding edge connector pins are connected together and to the corresponding edge connector stake pins 22. Thus, in FIG. 3B, edge connector pins 42, 44, and 46 are all connected to conductor 60. Conductor 60 is connected to edge connector stake pin 23A and to one terminal of switch 26A, which is one of the switches 26 in DIP packages 26'. The other terminal of switch 26A is connected to driver/sensor stake pin 22A. Similarly, the edge connector pins 41, 43 and 45 and edge connector stake pin 23B are all connected to conductor 62, which is connected to one side of switch 26B, which is also one of switches 26 in DIP packages 26'. The other terminal of switch 26' is connected to driver/sensor stake pin 22B. The remaining edge connector pins, edge connector stake pins, DIP switches, and driver/sensor stake pins of FIG. 2 and FIG. 3A are similarly connected.

FIG. 4 is a diagram depicting a side view of connector board 12, showing the edge connector pins of edge connectors 16, 18 and 20. FIG. 4 also shows a partial view of how a connector of family board 40 is plugged onto edge connector stake pins 23A and 23B.

FIG. 5 schematically indicates the connection of driver/sensor circuit 54A to driver/sensor stake pin 23C. As described in greater detail in the previously-mentioned Fulks application, the driver/sensor circuits are utilized to either drive or sense the state of a terminal of the board under test coupled thereto through the interconnecting means of the present invention. In a preferred embodiment of the invention, the driver/sensor stake pins each have an upper portion extending above connector board 12 and a lower portion extending below connector board 12 and connected directly to the input/output terminal of the corresponding driver/sensor circuit. The driver/sensor stake pin is connected to one terminal of switch 26C, the other terminal of which is connected to edge connector stake pin 22C and to edge connector pins 42, 44 and 46, as shown in FIG. 3B.

Referring now to FIG. 6, family board 40 includes a long, narrow board 40' with a plurality of conductors such as 80, 81, and 82 thereon. Family board 40 also includes a plurality of connectors, such as 70, 72 and 73, which are sockets which can receive groups of stake pins, such as groups 65 and 66. Stake pins 65 may, for example, be groups of driver/sensor stake pins extending from the surface of connector board 12; stake pins 66 may be edge connector stake pins. Conductors 77, 78 and 79 extending from selected pins of connector 70, are connected, respectively, to conductors 82, 81 and 80 of narrow board 40'. Corresponding conductors 77', 78' and 79' extending from selected pins of conductor 72 are also connected to conductors 82, 81 and 80, respectively. Connector 72 can be plugged onto stake pins 66. Thus, driver/sensor output signals applied to the driver/sensor stake pins 65 are coupled to conductors on board 40' and are then conducted to corresponding edge connector stake pins of group 66, and from there to the corresponding edge connector pins. It should be noted that the DIP switches connected to the driver/sensor stake pins connected to the routing conductors on board 40' must be in the open position. The dotted lines 70A and 72A indicate that, if convenient, connectors 70 and 72 may be rigidly attached to the side of narrow board 40'.

Connector 73 is connected by means of conductors 83, 84 and 85 to other conductors than 80, 81 and 82 of narrow board 40'. Conductor 73 can be plugged onto power supply stake pins such as 32, 34, so that appropriate power supply voltages can be routed to various ones of edge connector stake pins 66 by means of corresponding conductors 83', 84' and 85' connected to connector 73.

As previously explained, prior portable testers for digital circuit boards have required complex, bulky, and expensive interface adaptor boards to permit such prior portable testers to route power supply signals and input test signals from the portable tester to the appropriate pins of the board under test and to route signals produced at output pins of the board under test to the appropriate sensor circuits of the portable tester. The combination of the above-described "parallel connected" edge connectors with the three most common pin spacings, the interconnection of such edge connector pins and corresponding edge connector stake pins, DIP switches, and driver/sensor stake pins utilized in combination with the family board and its associated connectors avoids the need for such interface adaptor boards in most circumstances if programmable driver/sensor circuits, individually selectable by the main processor of the PSP, are utilized. The test program for the main processor of the PSP can be written to control the mode of each driver/sensor circuit and to route test data to selected ones of the driver/sensor circuits selected and determined by the PSP programmer.

Many of the details of the PSP described above and shown in the drawings herein are set forth in the above-mentioned Fulks application, incorporated herein by reference. The operation of the keyboard and various facets of the program and operation of the PSP of the present invention are also further described in the above-mentioned copending Fulks application.

Although the above-described elements of connector board 12 contribute greatly toward eliminating the necessity of complex interface adaptor boards, it is frequently desirable that a portable printed circuit board tester be capable of operating at high speeds which are necessary to provide convenient and comprehensive testing and fault isolation for a printed circuit board under test, as explained in the copending Fulks application. Up to now, only the previously described "factory testers" have been capable of suitably high speed operation and fault isolation. Unfortunately, factory testers incorporate far more memory circuitry, multiplexing circuitry and high speed main processor circuitry than is feasible, both from a cost and size point of view, for incorporation within a portable printed circuit board tester. For a portable tester which needs to accomplish the above-mentioned comprehensive high speed testing and fault isolation for printed digital circuit boards, part of the solution to the goal of eliminating complex interface adaptor boards while achieving suitable high speed testing operation lies in the area of minimizing the amount of high speed memory circuitry, high speed multiplexing circuitry, and high speed main processor circuitry required in the tester. Another part of the solution lies in the area of software techniques for accomplishing efficient, high speed routing of data from the main processor to the appropriate pins of the board under test.

According to the present invention, a high speed processor (HSP), which is programmable to operate at many times the speed of the comparatively slow main processor is utilized to operate in response to and simultaneously with the main processor to sequentially route data received in parallel format from the main processor to predetermined ones of the 192 driver/sensor circuits. The fast sequential outputting is accomplished by means of a subroutine, referred to herein as an "H" file, in the form of object code for the HSP and stored in the HSP memory. This subroutine defines groups of specific pins of the board under test as "destination busses" and sequentially routes sixteen bit data words each contained in a respective single instruction in the test program to such "destination busses".

The HSP is described in considerable detail in the copending Fulks application with reference to FIG. 5 thereof. The same diagram is repeated herein as FIG. 7. It should be noted that the same reference numerals are utilized in FIG. 5 herein as in FIG. 7 of the copending Fulks application (docket number 2653).

Referring now to FIG. 7, main processor 28" (described in detail in the copending Fulks application, docket number 2653), is connected to main bus 27. The elements of the HSP which are particularly pertinent to the above-mentioned high speed shifting of a data word from the main processor to a predefined "destination bus" of the board under test include the internal bus 161, parallel-loadable serial shift register 166, HSP random access memory 163, micro-controller 165, instruction register 169, read only memory 171, and control circuitry 151. These elements of the HSP cooperate to permit execution of a sequence of "shift data out" (SDO) instruction which sequentially shifts a data word previously parallel-loaded into serial shift register 166 to pin control circuit 151 at a pre-programmed machine cycle rate of the HSP. The predefined destination for each bit of data is specified, in HSP object code, as an argument of a corresponding SDO instruction stored in HSP memory 163. As each SDO instruction and its corresponding argument are loaded in response to micro-controller 165 into instruction register 169 from RAM 163, the corresponding bit of the data word in serial shift register 166 is shifted into pin control circuit 151. Read only memory 171 decodes the SDO instruction currently in instruction register 169 to produce various control signals on control bus 172, which has conductors connected to the various elements of the HSP to permit execution of the current SDO instruction.

The current bit of the data word shifted out of serial shift register 166 is directed via conductor 202, pin control circuit 151 and one of the conductors of bus 47 to the "H" input of the selected driver/sensor circuit of FIG. 3B of the copending Fulks application. The "argument" bits of the current instruction in instruction register 169 are gated to pin control circuitry 151 to produce an eight bit address for selecting one of the 192 driver/sensor circuits, which are described in detail with respect to FIGS. 3A–3C of the copending Fulks application. Other signals produced by read only memory 171 in decoding the current instruction in instruction register 169 operate to cause A, B, M, $\overline{CS}$, AS, and XS inputs (see FIG. 3B of copending Fulks application) to be produced on bus 47 for transmission to the selected driver/sensor circuit to control the mode and timing of the operation of the selected driver/sensor circuit, as further explained below.

As previously explained in the copending Fulks application, the PSP programmer utilizes a programming language, referred to as PSP BASIC, which utilizes most of the statements of the well-known programming language BASIC and further includes a number of additional statements particularly suited for use in a computer-based machine for testing logic circuits and systems such as digital printed circuit boards and products.

As further explained in the copending Fulks application, docket number 2653, micro-controller 165 of the HSP is a commerically available device which, in cooperation with the other elements of FIG. 5, operates as a separate processor capable of executing instructions stored in object code form in ramdon access memory 163.

In order to operate the HSP in conjunction with the main processor of the PSP to accomplish the high speed routing of data words to a predefined destination bus, as explained above, it is necessary for the PSP programmer to initially load a subroutine defining the destination bus in HSP object code into HSP memory 163 of FIG. 7. The subroutine includes a sequence of shift data out (SDO) instructions which each define a predetermined pin of the board under test which is to receive the corresponding bit of the data word loaded from the main processor into serial shift register 166 of the HSP. The group of such pins specified as arguments of the respective SDO instructions of the bus defining subroutine is referred to herein as the "destination bus".

The SDO bus-defining subroutine is utilized when the HSP is being utilized as an auxiliary high speed processor operated in conjunction with the much slower main processor, described with respect to FIG. 4 of the co-pending Fulks application, docket number 2653.

A number of preliminary steps, set forth in the flow diagram of FIG. 8A, are required to obtain the SDO bus-defining subroutine in a form useable by the HSP. Initially, the PSP programmer writes a special program in PSP BASIC including instructions constituting the bus-defining subroutine. The bus-defining subroutine includes a sequence of SDO instructions written in the HSP assembly language, each of the SDO instructions including in its argument a pin number of the board under test, which pin is the destination of the corresponding bit of the data word for which the destination bus is defined in the bus-defining subroutine. This subroutine is entered into the main processor and stored in its main memory, as indicated by block 211 of FIG. 8A. The main processor program includes instructions for operating the PSP as an HSP assembler. The bus-defining subroutine in the main memory is "run against" the HSP assembler to produce the HSP object code for the SDO bus-defining subroutine, as indicated by block 212 of FIG. 8A. The HSP object code for the SDO bus-defining subroutine is referred to herein as the "H" file.

The PSP programmer then stores the H file on magnetic tape as indicated by block 213. In the presently implemented embodiment of the invention, the H file is loaded from tape into the main memory of the PSP as indicated by block 214 of FIG. 8A. As subsequently explained, the H file is transferred from the main memory into HSP memory 163 during operation of the test program. At this point, the PSP is ready to execute the test program, which may then call up the bus-defining subroutine to accomplish high speed inputting of a data word from the main processor to the predefined destination bus.

The above bus-defining subroutine, as written in HSP assembly language into the main processor, may, for example, take the following form:

```
        ISR
        SDO 47

SDO 93
        SDO 1
        SDO 199
        SDO 132
           .
           .
           .
        HLT
```

The above bus-defining subroutine includes an "input to shift register" (ISR) instruction followed by a sequence of SDO instructions each specifying, as part of its argument, the address of the pin of the board under test which is the destination of the data bit of the data word in shift register 166 corresponding to that SDO instruction. This sequence is followed by a HLT (halt) instruction. The above program further includes instructions to run the HSP assembler to produce the above-mentioned H file and load it on magnetic tape. The PSP programmer can then load the H file from the magnetic tape into the main processor memory and also can load the test program for the board under test from the magnetic tape into the main processor memory, as indicated by block 214 of FIG. 8A. At the completion of the last step of the flow chart of FIG. 8A, the PSP is ready to run the test program.

The flow diagram of FIG. 8B shows the steps for shifting a data word from the main processor to the above pre-defined pins of the destination bus during execution of the test program in the main memory. The test program includes an instruction which loads the H file, presently in the main processor memory, into predetermined addresses of HSP memory 163. The test program for the board under test executes its various instructions until it is necessary to accomplish a rapid transfer of the data word to the destination bus defined in the H file. The test program then executes a "load high speed processor" (LHSP) instruction which loads the H file from the main processor memory into locations of HSP memory 163 beginning at a location of HSP memory 163 specified by the argument of the LHSP instruction, as indicated by block 221 in FIG. 8B. The next instruction of the PSP program is an "end load high speed processor" (ELHSP) instruction.

The test program next executes a "run high speed processor and continue" (RHSPC) instruction, having as its argument the first HSP memory address of the desired bus-defining subroutine in HSP memory 163, as indicated in block 222 of FIG. 8B. This causes the above ISR instruction to be executed. The RHSPC instruction starts execution of a subroutine presently in HSP memory at a location defined by the argument of the RHSPC instruction. This instruction not only starts the HSP subroutine running, but automatically causes the main processor to continue execution of subsequent instructions in the PSP basic program at its normal cycle rate.

When the ISR instruction is in HSP instruction register 169, it causes the HSP to load the next sixteen bit word from the main processor, which in this case is the 16 bit data word, to be loaded in parallel format into serial shift register 166 of the HSP. The ISR instruction, when executed, also causes the HSP to "wait" until the above sixteen bit data word is loaded into shift register 166.

Meanwhile, as soon as the main processor completes execution of the RHSPC instruction, it executes the next instruction of the test program. The next instruction of the test program is a "write high speed processor" (WHSP) instruction, which transmits the subject sixteen bit data word onto main bus 27, whereupon the HSP, in response to the above ISR instruction and instruction register 169, immediately parallel-loads the data word into shift register 166; this sequence of steps is represented by block 223 of FIG. 8B. It shall be noted that the argument of the WHSP instruction is the 16 bit data word.

As soon as the data word is loaded into shift register 166, the HSP executes the subsequent sequence of SDO instructions of the bus-defining subroutine until either all sixteen bits are shifted out of shift register 166 or until the HLT instruction is reached, independently of the much slower operating main processor. (It should be recognized that the HSP can be programmed by means of a number entered into HSP clock circuit 153 to oprate at fifty to one hundred times faster than main processor.) In the bus-defining subroutine loaded from the H file into the HSP memory 163, the sequence of SDO instructions is followed by a HLT (halt) instruction to prevent the next instruction in HSP memory 163 from being executed. Meanwhile, as indicated by block 225 of FIG. 8B, the PSP main processor executes a SHSP (stop HSP) instruction as soon as the WHSP instruction execution is completed. The purpose of the SHSP instruction in the program is to cause the main processor to wait for the HLT instruction in the bus-defining sub-routine to be executed by the HSP. Once the above HLT instruction is executed by the HSP, the main processor continues to execute subsequent instructions of the test program.

According to the invention, the HSP also has the capability of executing "shift data in" (SDI) instructions to rapidly sequentially shift data from pins of a predefined "source bus" or "output bus" of the board under test into the serial shift register 166 of FIG. 7; the data can then be outputted in parallel format to the main processor. The predefined "source bus" constitutes a plurality of pins defined in a SDI bus-defining subroutine stored in the HSP, in essentially the same manner that the previously described "destination busses" constitute a plurality of pins defined in the above-described SDO bus-defining subroutines stored in the HSP. When the SDI bus-defining subroutine is executed by the HSP, bits of data are sequentially routed from the predefined pins of the board under test into the serial data input 201 of serial shift register 166 of the HSP. Whe a complete sixteen bit word has been serially shifted into the serial shift register 166 in this manner, that sixteen bit word is transferred (in parallel format) onto the respective conductors of internal bus 161, and outputted by means of data out buffer circuitry 160 to the corresponding conductors of main bus 27, and from there to the main processor. Thus, high speed routing of data from the board under test back to the main processor is accomplished in a manner analogous to the above-described method of routing a word in parallel format from the main processor to a predefined destination bus of the board under test. The cooperation of the main processor and the HSP to store and execute a bus-defining subroutine including a plurality of SDI instructions having arguments defining a "source bus" constituting various output pins of the board under test is entirely analogous to the operation for the above-described bus-defining subroutines for "destination busses".

As explained in the copending Fulks application, the HSP has the capability of permitting the PSP to test an asynchronously operating printed circuit board or other asynchronously operating product, such as a printed circuit board including a microprocessor and a free-running clock generator. Prior printed circuit board testers have experienced considerable difficulty in efficiently testing asynchronously operating printed circuit boards.

According to the present invention, the HSP is capable of executing four "WAIT" commands, including "WAIT for pin to be high", "WAIT for pin to be low", "WAIT for fault", and "WAIT for no-fault". The operations of the HSP in executing each of these four WAIT commands are essentially similar. The operation of the HSP is to suspend or "freeze" the HSP clock signals produced by HSP clock generator 153 in FIG. 7 until the condition specified by the particular WAIT command is met. The execution of the particular WAIT instruction initiates the suspension of the subject clock cycle of HSP clock generator 153. Circuitry to implement clock circuitry 153 composed of counter circuits and other conventional gating and timing circuitry can readily be implemented by those skilled in the art. When the condition specified by the particular WAIT instruction is met, the suspension of the present HSP machine cycle is terminated. In order to detect whether the specified condition is met, the HSP includes exclusive OR circuitry 251 shown in FIG. 9, which circuitry has as one input a decoded output 253 from read only memory 171 indicating the presence of a WAIT command in instruction register 169. Other outputs of read only memory 171 produced by decoding of the WAIT instruction in instruction register 169 cause the occurrence of the appropriate pin high, pin low, fault, or no-fault conditions to produce a second input signal on input 255 to exclusive OR circuitry 251. If there is a matching of the signals on inputs 253 and 255, exclusive OR circuitry 251 causes a signal 172A to terminate the above suspension of the present clock cycle by HSP clock circuit 153. Of course, exclusive OR circuitry 251 can include inverting output circuitry to change polarity of the output signal at output 172A, if desired. Such exclusive OR circuitry is well known to those skilled in the art.

The main processor reacts to the high speed processor on the basis of various flags that are stored in status register 155 of the HSP; this is the only manner in which the HSP can control the main processor. The main processor must monitor the status of various flags in the status register 155 of the HSP in order to be controlled by the HSP. Thus, the manner in which the main processor and the HSP interact to permit the PSP to test an asynchronously operating board under test is as follows. When the HSP executes a WAIT instruction, it sets a flag in status register 155 and also suspends operation of clock generator 153 so that the HSP operation is halted. The main processor reads the contents of status register 155 and determines that that flag has been set, and then, if necessary, alters its own operation. Subsequently, when the conditions specified by the WAIT instruction occur, the HSP terminates suspension of the clocking of counter 153 and continues execution of the WAIT instruction and subsequent instructions in HSP memory 163 and also resets the above flag in status register 155. The main processor then reads status register 155 and continues. During any time that the main processor must "wait" on the HSP, the main processor simply "loops" on the flag in status register 155, and continues such looping until the flag is reset by the HSP.

Typically, the operation is that the main processor initiates some action in the HSP, for example by calling a bus-defining subroutine in the HSP, and then continues executing some other portion of the main program. If the main processor reaches a point at which it needs additional data from the HSP, the main processor than tests the appropriate flags of status register 155. Since the HSP operates much faster than the main processor, the required data will ordinarily be available, but if it is not available, the main processor is programmed to "loop" on the flag until the HSP produces the required data and resets the flag. The main processor then reads the data out register 160 to obtain such data.

The PSP is capable of executing a "binary increment pin" (BIP) instruction which increments by one the binary number represented by all bits on a bus defined by the BIP instruction, the bus including a plurality of pins specified in the argument of the BIP instruction. Similarly, a binary decrement pin (BDP) instruction decrements the binary number produced by the logic levels on the set of pins which constitute the argument of the BDP instruction. The BIP and BDP statements can be used within a FOR/NEXT loop to generate a large number of combinations of logic states on the specified pins.

An SPH (shift pin high) and an SPL (shift pin low) statement each shift the bits in a binary number produced by the logic states of a group of pins specified in the arguments of the SPH or SPL instruction from left to right. The SPH instruction replaces the left pin by a logical "one" each time the binary number is shifted to the right, whereas the SPL instruction replaces the right bit of the binary number with a logical "zero" for each shift to the left.

If the PSP addresses a particular pin of the board under test, the only information received on the fault lines (described in the copending Fulks application) is the information present on that pin. The information from the group fault line is inputted to priority encoder 150 of FIG. 7, and is routed from priority encoder 150 to the appropriate flag bit of status register 155, the CRC generator 180, and the pin state RAM 181. If necessary, the main processor "alters" its operation on the basis of the X flag in status register 155, which is set by the execution of a WAIT instruction by the HSP. This flag is reset when the condition specified by the particular WAIT command is met. In short, the pin response is gated through the pin control electronics and the priority encoder to one input of the exclusive OR circuitry 251 (FIG. 9), the other input of which is responsive to the WAIT instruction being executed. Signals decoded from the instruction register 169 correct the polarity of the exclusive OR output 172A such that the suspension of the HSP clock generator is terminated when the specified condition is met.

The PSP has the further capability of including instructions in the test program which instruct the operator how to initially "set up" the PSP for testing when a particular key is depressed. The main processor accesses the location of the third table defined by the signal received from the keyboard encoder indicating which of the keys is depressed. From this location the main processor obtains the binary code corresponding to the key word (such as SOE, name, etc., associated with the depressed key) from the address location of the third table and inputs it into the main processor input buffer. The main processor then executes the command represented by the information in the input buffer examining the contents of the input buffer in order to determine the next operation when the EXECUTE key is depressed. In short, the operation of the PSP with respect to the command key in conjunction with the main keys is essentially the same as its operation with respect to the shift key, except that the binary code for a string of letters, rather than an individual letter, is retrived from the appropriate table.

Those skilled in the art will recognize that the above system accomplishes the desired data transfer to the predefined destination bus at a very high speed and with very little programming effort compared to the programming effort which would be required if each data bit of the sixteen bit data word required one or more separate instructions to accomplish sequential shifting of that data bit to the appropriate pin of the destination bus.

It should also be apparent to those skilled in the art that the use of the high speed processor operating in conjunction with the much slower main processor obviates the need for the complex and expensive multiplexing circuitry circuit board or family of printed circuit boards. After the operator pushes the RUN key, after loading the test program from tape, the test program then causes the PSP to display specific instructions as to which family board to plug in, which switches in the DIP switch packages to open, and perhaps which cables should be utilized to connect various stake pins to additional connectors of the board under test. The test program then includes instructions which cause the PSP to test various pins to see if the correct power supply voltages appear thereon. The test program can also test certain unused pins of the family board which are shorted together in such a manner as to identify the family board and thereby verify whether the operator did indeed plug in the proper family board.

The keyboard 12 shown in FIG. 1B of the above-mentioned Fulks application and the method of using the "command keywords" are described in detail therein. A conventional keyboard encoder responsive to the keys of the PSP keyboard is located on the panel board coupled to the keyboard shown in FIGS. 1B and 2 of the Fulks application. The circuit operation of the command key is similar to the operation of the shift key. The software of the main processor receives signals from the keyboard encoder indicating which key of the keyboard is depressed and also indicating whether the shift key or the command key is depressed. This information is loaded into an input buffer of the main processor. The main processor utilizes the information to refer to one of three levels of keyboard inputs, namely, (1) neither the command key nor shift key are depressed, (2) the shift key is depressed, or (3) the command key is depressed.

It also should be recognized that additional bus-defining subroutines can be stored in the H file and individually called up by the PSP test program, so that a plurality of differently defined destination busses may be designated as destinations for high speed data transfers of data from the main processor.

I claim:
1. A tester for testing printed circuit boards comprising in combination:
   (a) a processor for storing and executing a test program;
   (b) a bus connected to said processor;
   (c) a plurality of programmable driver/sensor circuits controlled by said processor and having inputs coupled to the bus;
   (d) a circuit board connector for receiving a board to be tested;
   (e) a plurality of circuit board connecting means connected, respectively, to a plurality of terminals of said circuit board connector;
   (f) a plurality of driver/sensor connecting means connected, respectively, to outputs of said driver/sensor circuits;
   (g) a plurality of switching means each coupled between corresponding ones of said circuit board connecting means and respective ones of said driver/sensor connecting means;
   (h) first means for conducting electrical signals from various connecting means including predetermined ones of said driver/sensor connecting means to predetermined non-corresponding ones of said circuit board connecting means.

2. The tester of claim 1 wherein any of said switching means connected to said predetermined non-corresponding circuit board connecting means are open during operation of said tester.

3. The tester of claim 2 further including a plurality of power supplies and a plurality of power supply connecting means connected to the outputs of said power supplies, wherein said first means further includes second means for conducting power supply voltages from predetermined ones of said supply connecting means to other predetermined ones of said circuit board connecting means, wherein any of said switching means connected to said other predetermined circuit board connectors are open during operation of said tester.

4. The tester of claim 3 wherein said first means includes first and second receiving means for receiving said other predetermined circuit board connecting means and said predetermined power supply connecting means, respectively.

5. The tester of claim 3 wherein said first means includes first and second receiving means for receiving said non-corresponding predetermined circuit board connecting means and said predetermined driver/sensor connecting means, respectively.

6. The tester of claim 3 wherein:
(a) elements (d), (e), (f) and (g) are mounted on a first board;
(b) said power supply connecting means are mounted on said first board; and
(c) said plurality of driver/sensor connecting means are double pin stake pins, each of said double stake pins having an upper pin extending above said first board and a lower pin extending below said first board.

7. The tester of claim 1 wherein each of said circuit board connectors has a plurality of pins connected in parallel with pins of the other circuit board connectors.

8. The tester of claim 7 wherein each of said plurality of circuit board connectors has different pin spacings.

9. The tester of claim 4 wherein said first means includes a long, narrow board having a plurality of conductors thereon connected to respective pins of said first and second receiving means.

10. The tester of claim 6 wherein said switching means are manual switches in dual-in-line packages mounted on said first board.

11. The tester of claim 1 wherein said circuit board connecting means include a plurality of circuit board connector stake pins.

12. The tester of claim 1 wherein said driver/sensor connecting means include a plurality of driver/sensor stake pins.

13. A tester for testing printed circuit boards comprising in combination:
(a) a processor for storing and executing a test program;
(b) a bus connected to said processor;
(c) a plurality of programmable driver/sensor circuits controlled by said processor and having inputs coupled to the bus;
(d) an edge connector for receiving a board to be tested;
(e) a plurality of single connectors connected, respectively, to a plurality of the pins of said edge connector;
(f) a plurality of single connectors connected, respectively, to the outputs of said driver/sensor circuits;
(g) a plurality of switches each coupled between respective corresponding ones of said edge connector single connectors and a respective one of said driver/sensor single connectors; and
(h) first means for conducting electrical signals from various connectors including predetermined ones of said driver/sensor single connectors to predetermined non-corresponding ones of said edge connector single connectors.

14. A tester for testing printed circuit boards comprising in combination:
(a) a main processor for storing and executing a test program;
(b) a main bus coupled to said main processor for transmitting information to and from said main processor; and
(c) means responsive to said main bus for routing data from said main bus to predetermined pins of said board under test, said routing means including
  i. a plurality of programmable driver/sensor circuits each having a data input, a select input, an input/output terminal, and a mode control input;
  ii. means responsive to said main processor for inputting mode information, data, and select information received from said main bus to the mode control input, data input, and select input, respectively, of said driver/sensor circuits;
  iii. means for applying each bit of said data to the inputs of predetermined ones of said driver/sensor circuits;
  iv. an edge connector having a plurality of pins for electrically connecting pins of said board under test to said tester;
  v. a plurality of driver/sensor stake pins connected, respectively, to the input/output terminals of said driver/sensor circuits to permit external connection to said input/output terminals;
  vi. a plurality of edge connector stake pins connected, respectively, to corresponding pins of said edge connector to permit external connection to pins of said edge connector;
  vii. a plurality of switches coupled between corresponding ones of said driver/sensor stake pins and said edge connector stake pins for disconnecting selected ones of said input/output terminals from corresponding pins of said board under test;
  viii. a plurality of power supplies and corresponding power supply stake pins to permit external connection to the power supply voltages;
  ix. means for conducting electrical signals and power supply voltages from predetermined ones of said driver/sensor stake pins and power supply stake pins to predetermined edge connector stake pins.

* * * * *

UNITED STATES PATENT OFFICE
CERTIFICATE OF CORRECTION

Patent No. 4,196,386         Dated April 1, 1980

Inventor(s) Donald E. Phelps

It is certified that error appears in the above-identified patent and that said Letters Patent are hereby corrected as shown below:

Page 1, Abstract, line 26, "preocessor" should be --processor--.

Column 17, line 8, after "said" should be --power--.

Signed and Sealed this

Twenty-eighth Day of October 1980

[SEAL]

Attest:

SIDNEY A. DIAMOND

Attesting Officer          Commissioner of Patents and Trademarks